(12) United States Patent
Boujamaa et al.

(10) Patent No.: US 12,321,191 B2
(45) Date of Patent: Jun. 3, 2025

(54) SET-RESET CIRCUIT ARCHITECTURE

(71) Applicant: Arm Limited, Cambridge (GB)

(72) Inventors: El Mehdi Boujamaa, Valbonne (FR);
Robert Christiaan Schouten, Grasse (FR)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 18/113,448

(22) Filed: Feb. 23, 2023

(65) Prior Publication Data

US 2024/0288896 A1    Aug. 29, 2024

(51) Int. Cl.
*G06F 1/00* (2006.01)
*G06F 1/08* (2006.01)

(52) U.S. Cl.
CPC ..................................... *G06F 1/08* (2013.01)

(58) Field of Classification Search
None
See application file for complete search history.

(56) References Cited

U.S. PATENT DOCUMENTS

| | | | |
|---|---|---|---|
| 5,408,200 A | 4/1995 | Buhler | |
| 7,375,563 B1 | 5/2008 | Cheung et al. | |
| 8,635,503 B2 * | 1/2014 | Tang | G01R 31/318594 714/726 |
| 11,595,047 B1 | 2/2023 | Park et al. | |
| 2003/0007415 A1 | 1/2003 | Roohparvar | |
| 2004/0205095 A1 * | 10/2004 | Gressel | H03K 3/84 708/253 |
| 2006/0101315 A1 * | 5/2006 | Dhong | G06F 11/267 714/E11.16 |
| 2007/0262823 A1 | 11/2007 | Cohen et al. | |
| 2009/0217116 A1 * | 8/2009 | Motika | G01R 31/318541 714/E11.002 |
| 2012/0299974 A1 | 11/2012 | Park et al. | |
| 2016/0322979 A1 | 11/2016 | Upadhyaya et al. | |
| 2019/0052123 A1 | 2/2019 | Dina et al. | |
| 2019/0115908 A1 * | 4/2019 | Prasad | H03K 5/26 |
| 2020/0059260 A1 | 2/2020 | Ru et al. | |
| 2021/0376719 A1 | 12/2021 | Pullen et al. | |

OTHER PUBLICATIONS

Boujamaa, et al.; U.S. Appl. No. 17/519,490, filed Nov. 4, 2021.

* cited by examiner

*Primary Examiner* — Nitin C Patel
(74) *Attorney, Agent, or Firm* — Pramudji Law Group PLLC; Ari Pramudji

(57) ABSTRACT

In one implementation, a device includes a set-reset architecture with multiple latches including a first latch, a second latch and a third latch. The first latch may receive a first data signal from first logic and provide a first latched data signal as a first output based on a clock signal. The second latch may receive a second data signal from second logic and provide a second latched data signal as a second output based on the clock signal. The third latch may receive a third data signal from third logic and provide a third latched data signal as a third output based on the clock signal.

20 Claims, 6 Drawing Sheets

200

Adaptive Clocking Set-Reset State Machine Diagram

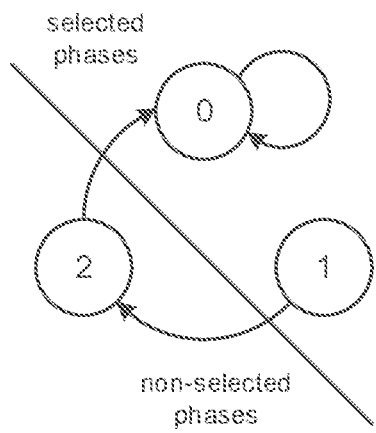

State Machine Diagram for Nominal Frequency 204A $$D0 = Q2 + Q0.\overline{TH1}$$

Threshold_1 = 0 : TH1 = 0
When Set at State_0, Reset will be done on State_1:
D1r = Q0 => clocked on ck_pll

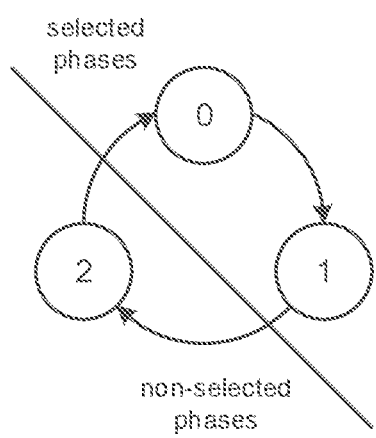

State Machine Diagram for +50% (1.5 duty cycle) 204B $$D1 = Q0.TH1$$

Threshold_1 = 1 : TH1 = 1
When Set at State_1, Reset will not be done (Idle):
D2r = Q1 => clocked on /ck_pll

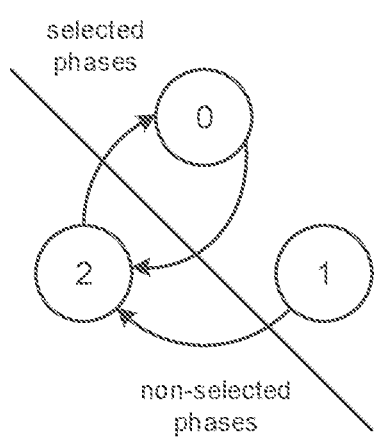

State Machine Diagram for +100% (2.0 duty cycle) 204C $$D2 = Q1 + Q0.TH2$$

Threshold_2 = 1 : TH2 = 1
When Set at State_2, Reset is directly done:
Q0r = Q2r => clocked on /ck_pll

FIG. 2

300
Adaptive Clocking Set-Reset Architecture 304
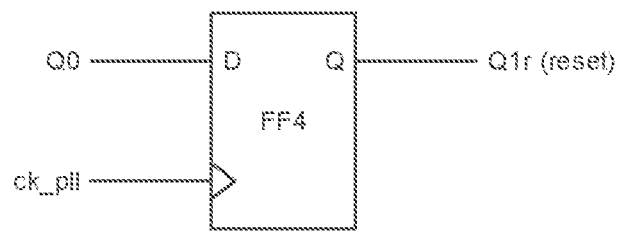
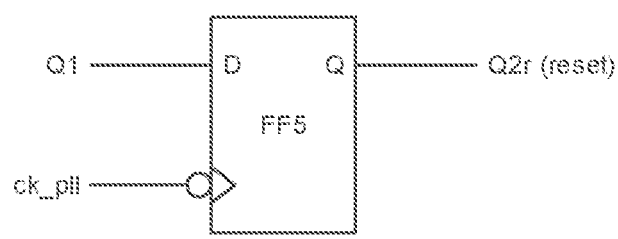
FIG. 3

SET-RESET CIRCUIT ARCHITECTURE

BACKGROUND

This section is intended to provide information relevant to understanding the various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In various modern circuit architectures, conventional clocking circuitry typically uses traditional logic circuitry, such as, e.g., buffers and clock gates. In the case of droop mitigation with clock stretching, one type of circuit that can be used is a digital clock divider having flip-flops that are only used to divide a clock frequency by a factor of 2. Therefore, in these types of circuits, there exist a need for a small, energy and area efficient circuit that can provide clock stretching smaller than a factor of 2.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

FIG. 2 illustrates a state machine diagram of adaptive clocking architecture in accordance with various implementations described herein.

FIG. 3 illustrates a diagram of adaptive clocking architecture in accordance with various implementations described herein.

DETAILED DESCRIPTION

Various implementations described herein are directed to fabrication schemes and techniques for adaptive clocking architecture in physical circuit designs for various circuit related applications including memory applications. In some implementations, the various schemes and techniques described herein provide for a novel adaptive clocking architecture that is based on multiple latches (or flip-flops) and logic that are arranged to provide, e.g., a reduced clock frequency with a 50% larger period. For instance, in the novel approach described herein, an intermediate step may be provided between Tck and 2×Tck so as to allow for improved average performances of the CPU, wherein the power consumption and area may be negligible since the circuit implemented herein is quote small. On top of that, the circuit may be significantly digital, such as, e.g., 100% digital, and the circuit may be implemented with circuit design tools, which may ease circuit design in various technology nodes.

One advantage of the novel adaptive clocking architecture as described herein may refer to significant design improvements by reducing system clock frequency when a power supply droop is detected. The various schemes and techniques described herein provide a digital circuit that takes advantage of a clock falling edge to produce a reduced clock frequency with a 50% larger period. With this approach, an extra stretch step may be enabled between nominal clock frequency and clock frequency/2 (e.g., half-frequency) without use of a delay locked loop (DLL), which makes it a low cost solution. For instance, in various applications, one advantage of designing and implementing a fully digital circuit may refer to using a digital flow, which has advantages, such as, e.g., an improved turn-around time, and improved functional verification coverage, over a custom design and/or implementation flow, e.g., when migrating a circuit from one process node to the next.

Various implementations of providing adaptive clocking set-reset schemes and techniques for various applications will be described in FIGS. 1A-1B and 2-4.

Figure 1A:
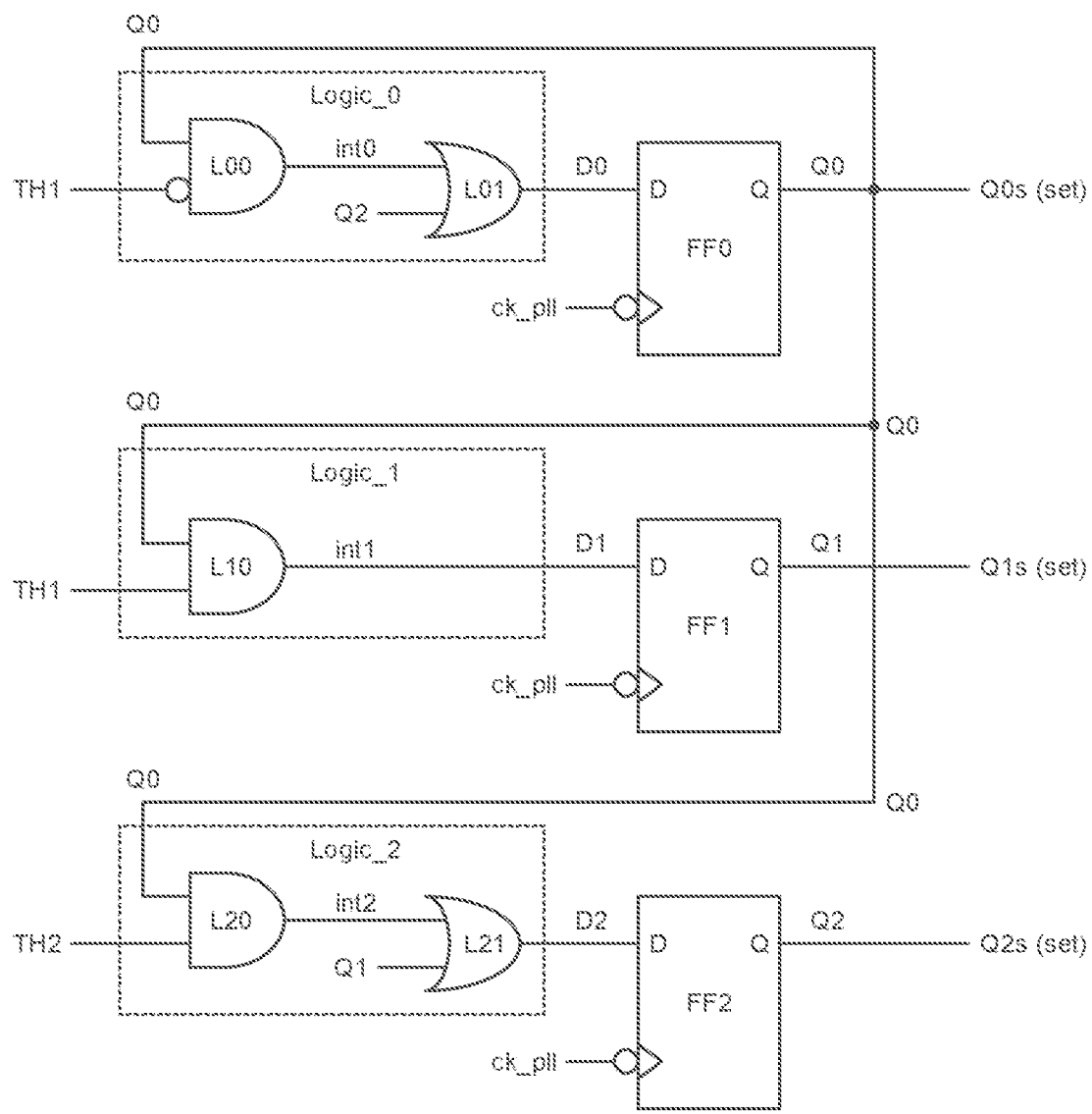
FIGS. 1A-1B illustrate various diagrams of adaptive clocking architecture in accordance with various implementations described herein.
Figure 1B:
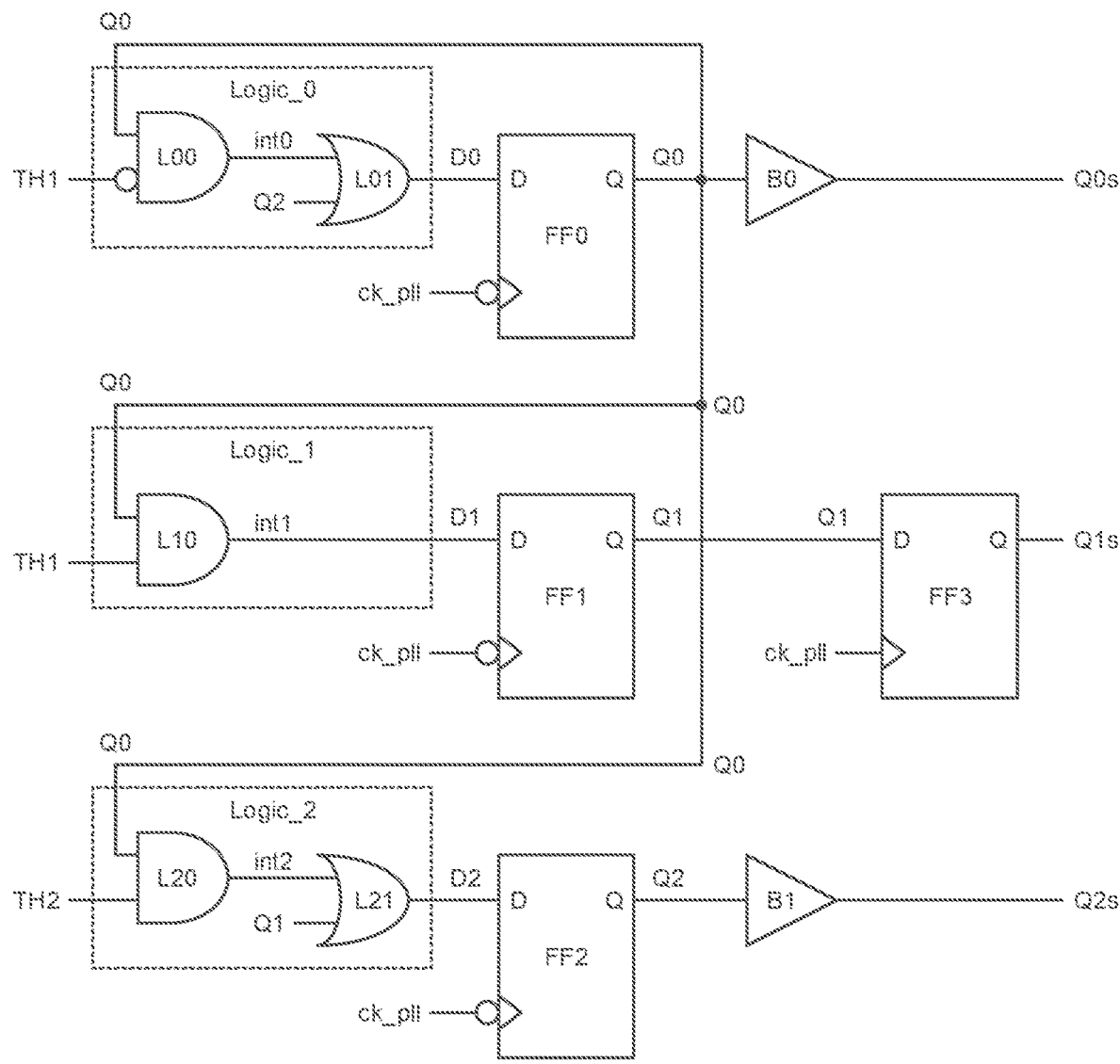

FIGS. 1A-1B illustrate various diagrams of adaptive clocking architecture 104 in accordance with various implementations described herein. In particular, FIG. 1A shows a schematic diagram of adaptive clocking architecture 104A, and FIG. 1B shows another schematic diagram of adaptive clocking architecture 104B.

In various implementations, the adaptive clocking architecture 104 may refer to adaptive clocking set-reset architecture that may be implemented as a system or a device having various integrated circuit (IC) components that are arranged and coupled together as an assemblage or some combination of parts that provide for physical circuit designs and various related structures. In various instances, a method of designing, providing and fabricating the adaptive clocking architecture 104 as an integrated system or device may involve use of various IC circuit components and/or structures described herein so as to thereby implement fabrication schemes and techniques associated therewith. In addition, the adaptive clocking architecture 104 may be integrated with various computing circuitry and related components on a single chip, and also, the adaptive clocking architecture 104 may be implemented in various embedded devices and/or systems for some automotive, electronic, mobile, computer, server and Internet-of-things (IoT) applications.

As shown in FIG. 1A, the adaptive clocking architecture 104A may refer to adaptive clocking set-reset architecture for various circuit applications. Also, the adaptive clocking architecture 104A may include multiple latches, including, e.g., a first latch (FF0), a second latch (FF1) and a third latch (FF2). The first latch (FF0) may receive a first data signal (D0) from first logic (Logic_0) and provide a first latched data signal (Q0) as a first output based on a clock signal (ck_pll). The second latch (FF1) may receive a second data signal (D1) from second logic (Logic_1) and provide a second latched data signal (Q1) as a second output based on the clock signal (ck_pll). The third latch (FF2) may receive a third data signal (D2) from third logic (Logic_2) and provide a third latched data signal (Q2) as a third output based on the clock signal (ck_pll). The multiple latches may refer to multiple flip-flops (e.g., D flip-flops), wherein the first latch (FF0) may refer to a first flip-flop (1st DFF), the second latch (FF1) may refer to a second flip-flop (2nd DFF), and the third latch (FF2) may refer to a third flip-flop (3rd DFF).

In various implementations, the first output (Q0) may refer to a first set signal (Q0s), the second output (Q1) may refer to a second set signal (Q1s) that is different than the first set signal (Q0s), and the third output (Q2) may refer to a third set signal (Q2s) that is different than the first set signal (Q0s) and the second set signal (Q1s). Also, the first latch (FF0) may receive the clock signal (ck_pll) at an inverting clock input and then provide the first output (Q0) as the first set signal (Q0s). Also, the second latch (FF1) may receive the clock signal (ck_pll) at an inverting clock input and then provide the second output (Q1) as the second set signal (Q1s). Also, the third latch (FF2) may receive the clock signal (ck_pll) at an inverting clock input and then provide the third output (Q2) as the third set signal (Q2s).

In various implementations, the first latch (FF0) may receive the first data signal (D0), receive the first output (Q0), and provide the first output (Q0) as the first set signal (Q0s) based on the clock signal (ck_pll). Also, the first output (Q0) may be provided as a feedback signal that is provided back to an input of the first logic (Logic_0). The second latch (FF1) may receive the second data signal (D1), receive the first output (Q0), and provide the second output (Q1) as a second set signal (Q1s) based on the clock signal (ck_pll). Also, the first output (Q0) may be provided as a feedback signal that is provided back to an input of the second logic (Logic_1). The third latch (FF2) may receive the third data signal (D2), receive the first output (Q0), and provide the third output (Q2) as a third set signal (Q2s) based on the clock signal (ck_pll).

In various implementations, the first logic (Logic_0) may include one or more gates, including, e.g., a first gate (L00) and a second gate (L01). The first gate (L00) may receive a first threshold signal (TH1) at an inverting input, receive the first output signal (Q0) from the first latch (FF0), and provide a first intermediate signal (int0) to the second gate (L01). The second gate (L010) may receive the first intermediate signal (int0), receive the third output (Q2) from the third latch (FF2), and provide the first data signal (D0) to the first latch (FF0). Also, the first gate (L00) may be configured to operate as an AND gate, and the second gate (L01) may be configured to operate as an OR gate.

In various implementations, the second logic (Logic_1) may include at least one gate, including, e.g., a third gate (L10). The third gate (L10) may receive the first threshold signal (TH1), receive the first output signal (Q0) from the first latch (FF0), and provide a second intermediate signal (int1) to the second gate (FF1). In some instances, the second intermediate signal (int1) may refer to the second data signal (D1). In various instances, the second intermediate signal (int1) may be provided to the second latch (FF1) so as to provide the second output (Q1) as a +50% clock period signal (i.e., the period of the signal is extended, or stretched, to 1.5× its original period). Also, the third gate (L10) may be configured to operate as an AND gate.

In various implementations, the third logic (Logic_2) may include one or more logic gates, including, e.g., a fourth gate (L20) and a fifth gate (L21). The fourth gate (L20) may receive a second threshold signal (TH2), receive the first output (Q0) from the first latch (FF0), and provide a third intermediate signal (int2) to the fifth gate (L21). Also, the fifth gate (L21) may receive the third intermediate signal (int2), receive the second output (Q1) from the second latch (FF1), and provide the third data signal (D2) to the third latch (FF2). In various instances, the third intermediate signal (int2) may be provided to the third latch (FF2) so as to provide the third output (Q2) as a +100% clock period signal (i.e., the period of the signal is extended, or stretched, to 2× its original period). Also, the fourth gate (L20) may be configured to operate as an AND gate, and the fifth gate (L21) may be configured to operate as an OR gate.

In various implementations, the first threshold TH1 may refer to the output of a voltage droop detector that is flipped from 0 to 1 (logic values) when power supply voltage reaches a first voltage threshold. For instance, if nominal supply voltage (Vdd) is 1V and the first threshold voltage is at −5%, then TH1=0, if 1V>Vdd>0.95V, and also, TH1=1 when Vdd<0.95V. Also, TH2 may refer to a second threshold voltage that may be set lower than the first threshold voltage TH2. For instance, if the second threshold voltage TH2 is −10%, then TH2=0, if 1V>Vdd>0.9V, and also, TH2=1 when Vdd<0.9V.

In various implementations, TH1 and TH2 refer to signals that indicate that the supply voltage droop has crossed a particular threshold level below the nominal supply voltage Vdd. For instance, with a nominal 900 mV supply voltage, the first threshold may be 870 mV and the second threshold 840 mV. The indicator signal TH1 may then be set once the supply voltage Vdd droops below 870 mV, thus indicating a moderate droop, and TH2 may flag a supply voltage droop that descends below 840 mV (deep droop). Also, in various instances, a corresponding reaction of the adaptive clocking circuitry described herein may be to stretch the clock period with an extra 50% in case of a moderate droop, and/or stretch the clock period with an extra 100% for a deep droop.

As shown in FIG. 1B, the adaptive clocking architecture 104B may also refer to adaptive clocking set-reset architecture for various circuit applications. Also, in various applications, the adaptive clocking architecture 104B shown in FIG. 1B may have similar circuitry, components and/or various other features in a manner as shown in the adaptive clocking architecture 104A of FIG. 1A.

Also, in various implementations, the adaptive clocking architecture 104B may include multiple latches, including, e.g., the first latch (FF0), the second latch (FF1), the third latch (FF2), and a fourth latch (FF3). The first latch (FF0) may receive the first data signal (D0) from the first logic (Logic_0) and provide the first latched data signal (Q0) as the first output based on the clock signal (ck_pll). The second latch (FF1) may receive the second data signal (D1) from the second logic (Logic_1) and then provide the second latched data signal (Q1) as the second output based on the clock signal (ck_pll). Also, the third latch (FF2) may receive the third data signal (D2) from the third logic (Logic_2) and provide the third latched data signal (Q2) as the third output based on the clock signal (ck_pll). Also, the fourth latch (FF3) may receive the second latched data signal (Q1) (as the second output) from the second latch (FF1) and provide a fourth latched data signal (Q1s) as the second set signal (Q1s) based on the clock signal (ck_pll). Also, the fourth latch (FF3) may receive the clock signal (ck_pll) at a non-inverting clock input and then provide the second set signal (Q1s).

In various implementations, the multiple latches may refer to multiple flip-flops (e.g., D flip-flops), wherein the first latch (FF0) may refer to a first flip-flop (1st DFF), the second latch (FF1) may refer to a second flip-flop (2nd DFF), the third latch (FF2) may refer to a third flip-flop (3rd DFF), and the fourth latch (FF3) may refer to a fourth flip-flop (4th DFF). In various instances, the second intermediate signal (int1) may be provided to the second latch (FF1) so as to provide the second output (Q1) to the fourth Latch (FF3) as a +50% clock period signal (i.e., the period of the signal is extended, or stretched, to 1.5× its original period). Also, in various instances, the third intermediate signal (int2) may be provided to the third latch (FF2) so as to provide the third output (Q2) as a +100% clock period signal (i.e., the period of the signal is extended, or stretched, to 2× its original period).

Also, in various implementations, the adaptive clocking architecture 104B may include multiple output buffers (B0, B1) that may be configured to receive the output (e.g., Q0, Q2) and provide set signals (e.g., Q0s, Q2s). For instance, the multiple output buffers (B0, B1) may include a first output buffer (B0) that may be configured to receive the first output (Q0) and provide the first set signal (Q0s). Also, in some instances, the multiple output buffers (B0, B1) may include a second output buffer (B1) that may be configured to receive the third output (Q2) and provide the third set signal (Q2s).

FIG. 2 illustrates a state machine diagram 200 for use with adaptive clocking architecture in accordance with various implementations described herein. Also, in some applications, the adaptive clocking architecture 104A, 104B in FIGS. 1A-1B may be used to describe various transitional states (0, 1, 2) of the state machine diagram 200.

As shown in FIG. 2, the state machine diagram 200 includes a state machine diagram for nominal frequency 204A having selected phases and non-selected phases that provide multiple transitional logic states, including, e.g., a first logic state (0), a second logic state (1), and a third logic state (2). In various instances, the first logic state (0) may refer to a selected state that may return to itself. Also, the second logic state (1) may refer to a selected state that may transition to the third logic state (2). Also, the third logic state (2) may refer to a non-selected state that may transition to the first logic state (0).

In reference to the adaptive clocking architecture 104A, 104B in FIGS. 1A-1B, the D0 signal may equal to the Q2 signal plus the Q0 signal with the inverted first threshold signal (not TH1), such that D0=Q2+Q0·TH1(not). In some applications, when the first threshold signal (TH1: Threshold_1) equals zero (0), then reset will be done on the second state (State_1), in reference to state machine diagram for nominal frequency 204A. Also, the reset signal (D1r) may equal the Q0 signal when clocked on ck_pll.

As shown in FIG. 2, the state machine diagram 200 includes a state machine diagram for +50% clock period (i.e., the period of the signal is extended, or stretched, to 1.5× its original period) 204B having selected phases and non-selected phases that provide multiple transitional logic states, including, e.g., the first logic state (0), the second logic state (1), and the third logic state (2). In some instances, the first logic state (0) may refer to a selected state that may transition to the second logic state (1). Also, the second logic state (1) may refer to a selected state that may transition to the third logic state (2). Also, the third logic state (2) may refer to a non-selected state that may transition to the first logic state (0).

In reference to the adaptive clocking architecture 104A, 104B in FIGS. 1A-1B, the D1 signal may equal to the Q0 signal with the first threshold signal (TH1), such that D1=Q0·TH1. In some applications, when the first threshold signal (TH1: Threshold_1) equals one (1), then set will be done on the second state (State_1), and also, reset will not be done (idle), in reference to the state machine diagram for nominal frequency 204B. Also, the reset signal (D2r) may equal the Q1 signal when clocked on/ck_pll.

As shown in FIG. 2, the state machine diagram 200 includes a state machine diagram for 100% clock period (i.e., the period of the signal is extended, or stretched, to 2× its original period) 204C having selected phases and non-selected phases that provide multiple transitional logic states, including, e.g., the first logic state (0), the second logic state (1), and the third logic state (2). In some instances, the first logic state (0) may refer to a selected state that may transition to the third logic state (2). Also, the second logic state (1) may refer to a selected state that may transition to the third logic state (2). Also, the third logic state (2) may refer to a non-selected state that may transition to the first logic state (0).

In reference to the adaptive clocking architecture 104A, 104B in FIGS. 1A-1B, the D2 signal may equal to the Q1 signal plus the Q0 signal with the second threshold signal (TH2), such that D2=D1+Q0·TH2. In some applications, when the second threshold signal (TH2: Threshold_2) equals one (1), then set will be done on the third state (State_2), and also, the reset is directly done, in reference to state machine diagram for +100% clock period (i.e., the period of the signal is extended, or stretched, to 2× its original period) 204C. Also, the reset signal (D0r) may equal the Q2r signal when clocked on/ck_pll.

FIG. 3 illustrates a schematic diagram 300 of adaptive clocking architecture 304 in accordance with various implementations described herein.

In various implementations, the adaptive clocking architecture 304 may refer to adaptive clocking set-reset architecture that may be implemented as a system or a device having various integrated circuit (IC) components that are arranged and coupled together as an assemblage or some combination of parts that provide for physical circuit designs and various related structures. In various instances, a method of designing, providing and fabricating the adaptive clocking architecture 304 as an integrated system or device may involve use of various IC circuit components and/or structures described herein so as to thereby implement fabrication schemes and techniques associated therewith. In addition, the adaptive clocking architecture 304 may be integrated with various computing circuitry and related components on a single chip, and also, the adaptive clocking architecture 304 may be implemented in various embedded devices and/or systems for some automotive, electronic, mobile, computer, server and Internet-of-things (IoT) applications.

As shown in FIG. 3, the adaptive clocking architecture 304 refers to adaptive clocking set-reset architecture for various circuit applications. Also, the adaptive clocking architecture 304 may include at least one buffer (B2) and multiple latches, including, e.g., a fifth latch (FF4) and a sixth latch (FF5). The at least one buffer (B2) may receive a first data signal (Q2r) and provide a first output (Q0r). Also, the fifth latch (FF4) may receive a second data signal (Q0) and provide a first latched data signal as a second output (Q1r) based on the clock signal (ck_pll). The sixth latch (FF5) may receive a third data signal (Q1) and provide a second latched data signal as a third output (Q2r) based on the clock signal (ck_pll), such that the third output (Q2r) is applied to the at least one buffer (B2) as the first data signal (Q2r).

In various implementations, the multiple latches may refer to multiple flip-flops (e.g., D flip-flops), wherein the fifth latch (FF4) may refer to a fifth flip-flop (DFF), and the sixth latch (FF5) may refer to a sixth flip-flop (DFF). Also, the first output (Q0r) may refer to a first reset signal (Q0r), the second output (Q1r) may refer to a second reset signal (Q1r) that is different than the first reset signal (Q10), and the third output (Q2r) may refer to a third reset signal (Q2r) that is different than the first reset signal (Q0r) and the second reset signal (Q1r).

In various implementations, the fifth latch (FF4) may receive the clock signal (ck_pll) at a non-inverting clock input and then provide the second output (Q1r) as the second reset signal (Q1r). Also, the sixth latch (FF5) may receive the clock signal (ck_pll) at an inverting clock input and then provide the third output (Q2r) as the third reset signal (Q2r).

In various implementations, the fifth latch (FF4) may receive the first output (Q0) from the first latch (FF0) of the adaptive clocking architecture 104A in FIG. 1A, and then provide the second reset signal (Q1r) based on the clock signal (ck_pll). Also, in various instances, the first output (Q0) may refer to the first set signal (Q0s).

In various implementations, the sixth latch (FF5) may receive the second output (Q1) from the second latch (FF1) of the adaptive clocking architecture 104A in FIG. 1A, and provide the third reset signal (Q2r) based on the clock signal (ck_pll). Also, in various instances, the second output (Q1) may refer to the second set signal (Q1s).

Figure 4:
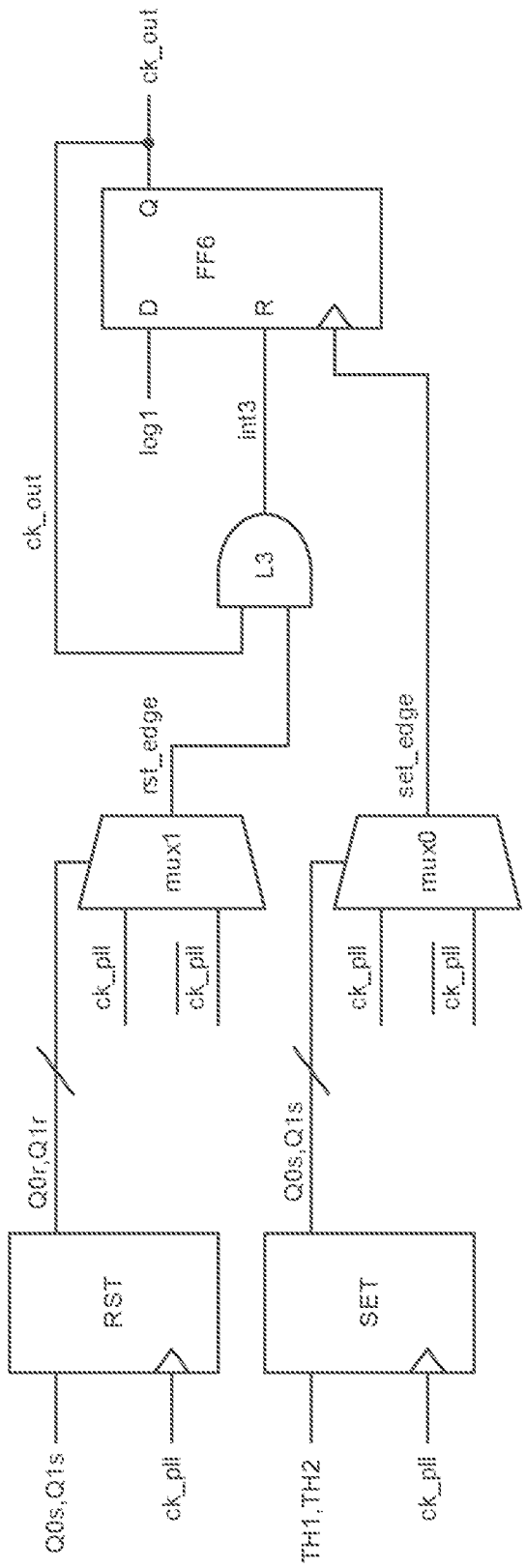
FIG. 4 illustrates a diagram of set-reset architecture with adaptive clocking in accordance with various implementations described herein.

FIG. 4 illustrates a diagram 400 of set-reset architecture 404 having adaptive clocking capability in accordance with various implementations described herein. In some applications, the adaptive clocking architecture 104A, 104B in FIGS. 1A-1B may be used to describe set circuitry in the set-reset architecture 404 in FIG. 4. In some applications, the adaptive clocking architecture 304 in FIG. 3 may be used to describe reset circuitry in the set-reset architecture 404 in FIG. 4.

In various implementations, the set-reset architecture 404 may refer to adaptive clocking set-reset architecture that may be implemented as a system or a device having various integrated circuit (IC) components that are arranged and coupled together as an assemblage or some combination of parts that provide for physical circuit designs and/or various related structures. In various applications, a method of designing, providing and fabricating the set-reset architecture 404 as an integrated system or device may involve use of various IC circuit components and/or structures described herein so as to thereby implement fabrication schemes and techniques associated therewith. In addition, the set-reset architecture 404 may be integrated with various computing circuitry and components on a single chip, and also, the set-reset architecture 404 may be implemented in various embedded devices and/or systems for various automotive, electronic, mobile, computer, server and/or Internet-of-things (IoT) applications including remote sensor nodes.

In some implementations, as shown in FIG. 4, the set-reset architecture 404 may refer to adaptive clocking set-reset architecture for various circuit applications. Also, the set-reset architecture 404 may include set circuitry (SET) and reset circuitry (RST), wherein the set circuitry (SET) may refer to the adaptive clocking architecture 104A, 104B shown in FIGS. 1A-1B, and the reset circuitry (RST) may refer to the adaptive clocking architecture 304 shown in FIG. 3. In some applications, the set circuitry (SET) and the reset circuitry (RST) may receive the clock signal (ck_pll), and the set circuitry (SET) may also receive the threshold signals (TH1, TH2), and also, the reset circuitry (RST) may also receive set signals (Q0s, Q1s) as feedback signals from the SET circuitry (SET). Also, in various applications, the set circuitry (SET) may generate and provide the set signals (Q0s, Q1s) based on the clock signal (ck_pll) and threshold signals (TH1, TH2), and also, the reset circuitry (RST) may generate and provide the reset signals (Q0r, Q1r) based on the clock signal (ck_pll) and the set signals (Q0s, Q1s).

In some implementations, the set-reset architecture 404 may have one or more multiplexers (mux0, mux1), including a first multiplexer (mux0) coupled to the set circuitry (SET) and a second multiplexer (mux1) coupled to the reset circuitry (RST). Also, the set circuitry (SET) may receive clock signals (ck_pll, not ck_pll) and provide a set-edge signal based on set signals (Q0s, Q1s) as a mux-selection signal. Also, the reset circuitry (RST) may receive clock signals (ck_pll, not ck_pll) and provide a rst-edge signal based on reset signals (Q0r, Q1r) as a mux-selection signal. The first mux (mux0) may provide the set-edge signal to an output flip-flop (FF6). The second mux (mux1) may provide the rst-edge signal to logic gate (L3), the output flip-flop (FF6) may provide clock output signal (ck_out) to the logic gate (L3), and the logic gate (L3) may provide an intermediate signal (int3) to the output flip-flop (FF6) based on a logical operation of the logic gate (L3). Also, logic 1 signal (log 1) or Vdd may be coupled to data input (D) of output flip-flop (FF6). Therefore, in various applications, the output flip-flop (FF6) may be configured to provide the clock output signal (ck_out) based on one or more signals, including, e.g., one or more of the logic 1 signal (log 1), the set-edge signal, and the intermediate signal (int3), which is based on the rst_edge signal and the clock output signal (ck_out).

Moreover, in some implementations, the set-reset architecture 404 may involve use of a truth table 408 to describe various logical input-output (IO) operations of the set-reset architecture 404. For instance, as shown in truth table 408, when Q1r/Q1s signals are logic zero (0), and Q0r/Q0s are logic zero (0), then the rst_edge/set_edge signals are also logic zero (0). Also, when Q1r/Q1s signals are logic zero (0), and Q0r/Q0s are logic one (1), then the rst_edge/set_edge signals refer to the ck_pll signal. Also, when Q1r/Q1s signals are logic one (1), and Q0r/Q0s are logic zero (0), then rst_edge/set_edge signals refer to the not ck_pll signal. Also, when Q1r/Q1s signals are logic one (1), and Q0r/Q0s are logic one (1), then rst_edge/set_edge signals float or do not exist or are unused.

Figure 5:
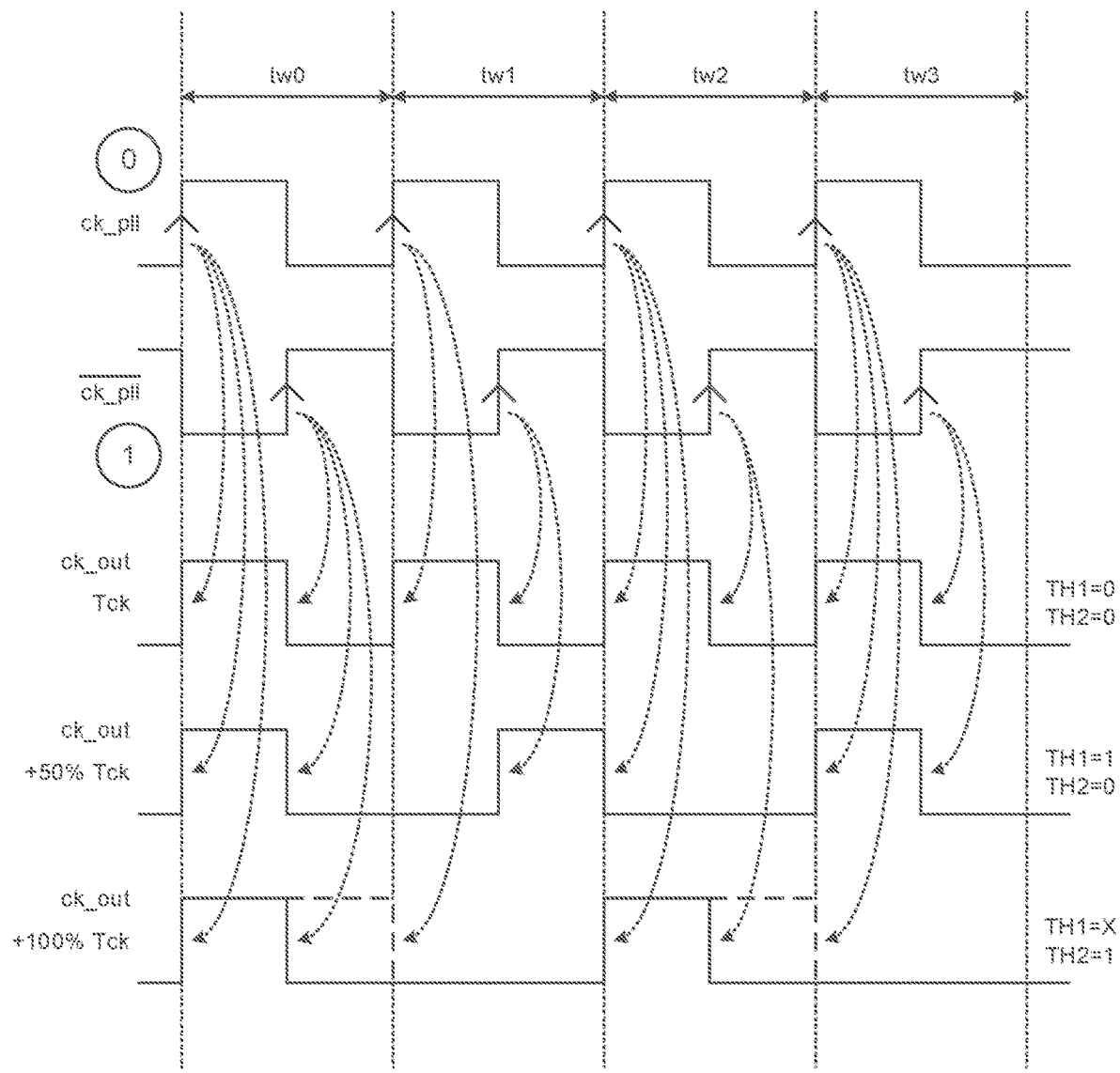
FIG. 5 illustrates a waveform diagram related to operating adaptive clocking architecture in accordance with various implementations described herein.

FIG. 5 illustrates a waveform diagram 500 for operating the adaptive clocking architecture in accordance with various implementations described herein. Also, in some applications, the adaptive clocking architecture 104A, 104B in FIGS. 1A-1B may be used to describe various transitional states (0, 1) of the waveform diagram 500. Also, in some other applications, the set-reset architecture 404 in FIG. 4 may also be used to describe various transitional states (0, 1) of the waveform diagram 500. For instance, the ck_out signal in FIG. 4 may refer to the same ck_out signals in FIG. 5, which may in different clock cycle timing periods, such as, e.g., Tck (1.0) clock cycle pulse, +50% (1.5) Tck clock cycle pulse, and +100% (2.0) Tck clock cycle pulse.

As shown in FIG. 5, the waveform diagram 500 shows multiple timing periods (e.g., tw0, tw1, tw2, tw3) that show pulse triggering of the adaptive clocking architecture 104A, 104B in FIGS. 1A-1B. In various instances, the ck_pll signal may refer to a single pulse within each timing period (tw0, tw1, tw2, tw3), and also, the inverted ck_pll signal (not ck_pll) may refer to a single inverted pulse within each timing period (tw0, tw1, tw2, tw3), which is opposite in polarity to the ck_pll signal.

As shown in FIG. 5, the waveform diagram 500 shows multiple timing periods (e.g., tw0, tw1, tw2, tw3) for the Tck clock cycle pulse that shows pulse triggering of the adaptive clocking architecture 104A, 104B in FIGS. 1A-1B. In various instances, in the tw0 timing period, the rising edge of the ck_pll signal triggers the rising edge of the first Tck pulse, and in the tw1 timing period, the rising edge of the ck_pll signal triggers the rising edge of the second Tck pulse, in the tw2 timing period, the rising edge of the ck_pll signal triggers the rising edge of the third Tck pulse, and in the tw3 timing period, the rising edge of the ck_pll signal triggers the rising edge of the fourth Tck pulse. Thus, in some instances, the Tck (1.0) pulses mirror the ck_pll signals.

As shown in FIG. 5, the waveform diagram 500 shows multiple timing periods (e.g., tw0, tw1, tw2, tw3) for the +50% Tck clock cycle pulse that shows pulse triggering of the adaptive clocking architecture 104A, 104B in FIGS. 1A-1B. In various instances, in the tw0 timing period, the rising edge of the ck_pll signal triggers the rising edge of the first +50% Tck pulse, and in the tw1 timing period, the rising edge of the inverted ck_pll signal (not ck_pll) triggers the rising edge of the second +50% Tck pulse, and in the tw3 timing period, the rising edge of the ck_pll signal triggers the rising edge of the third +50% Tck pulse. In some instances, the +50% Tck pulse refers to a Tck (1.5) pulse.

As shown in FIG. 5, the waveform diagram 500 shows multiple timing periods (e.g., tw0, tw1, tw2, tw3) for the +100% clock cycle pulse that shows pulse triggering of the adaptive clocking architecture 104A, 104B in FIGS. 1A-1B. In various instances, in the tw0 timing period, the rising edge of the ck_pll signal triggers the rising edge of the first +100% pulse, and in the tw2 timing period, the rising edge of the ck_pll signal triggers the rising edge of the second +100% pulse. In some instances, the +100% Tck pulse refers to a Tck (2.0) pulse.

Also, in various implementations, in reference to timing periods (tw1, tw3), the starting/rising edge of the ck_pll signal may be used to trigger the starting/rising edge of the ck_out Tck signal and/or the starting/rising edge of the ck_out+100% Tck signal. The idea here is that there may be multiple ways (e.g., at least 2 ways) to generate and provide the +100% Tck stretch signal, wherein a first way uses the rising edge of ck_pll to trigger or bring the Tck clock signal down, or a second way uses the rising edge of the ck_pll signal to trigger or bring the Tck clock signal up.

In various implementations, in reference to FIGS. 1A-1B and 2-5, the adaptive clocking architecture 104, 304 may be configured to operate together so as to provide the set signals (Q0s, Q1s, Q2s) and/or the reset signals (Q0r, Q1r, Q2r).

For instance, in some applications, the adaptive clocking architecture 104, 304 may be configured to operate as set-reset architecture having set circuitry 104 and reset circuitry 304. The set circuitry 104 may include logic gates and first latches arranged to receive multiple different data signals and then provide multiple different set signals (Q0s, Q1s, Q2s) based on the clock signal (ck_pll). Also, the reset circuitry 304 may include at least one buffer and second latches arranged to receive the multiple different set signals (Q0s, Q1s, Q2s) from the set circuitry 104 and then provide multiple different reset signals (Q0r, Q1r, Q2r) based on the clock signal (ck_pll).

In various applications, the first latches may include a first latch, a second latch, and a third latch. The first latch may receive a first data signal from first logic and provide a first latched data signal as a first set signal of the multiple different set signals based on the clock signal. The second latch may receive a second data signal from second logic and provide a second latched data signal as a second set signal of the multiple different set signals based on the clock signal. The third latch may receive a third data signal from third logic and provide a third latched data signal as a third set signal of the multiple different set signals based on the clock signal. The first latches may refer to first flip-flops, wherein the first latch refers to a first flip-flop, the second latch refers to a second flip-flop, and the third latch refers to a third flip-flop.

In various applications, the second latches may include a fourth latch and a fifth latch. The at least one buffer may receive an input signal and provide a first reset signal of the multiple different reset signals. The fourth latch may receive the first set signal and provide a fourth latched data signal as a second reset signal based on the clock signal. The fifth latch may receive the second set signal and provide a fifth latched data signal as the third reset signal that is applied to the at least one buffer as the input signal based on the clock signal. The second latches may refer to second flip-flops, wherein the fourth latch refers to a fourth flip-flop, and the fifth latch refers to a fifth flip-flop.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Described herein are various implementations of a device including a set-reset architecture with multiple latches including a first latch, a second latch and a third latch. The first latch may receive a first data signal from first logic and provide a first latched data signal as a first output based on a clock signal. Also, the second latch may receive a second data signal from second logic and provide a second latched data signal as a second output based on the clock signal. Also, the third latch may receive a third data signal from third logic and provide a third latched data signal as a third output based on the clock signal.

Described herein are various implementations of a device including a set-reset architecture having at least one buffer and multiple latches including a first latch and a second latch. The at least one buffer may receive a first data signal and provide a first output. The first latch may receive a second data signal and provide a first latched data signal as a second output based on a clock signal. The second latch may receive a third data signal and provide a second latched data signal as a third output based on the clock signal, such that the third output is applied to the at least one buffer as the first data signal.

Described herein are various implementations of a device including a set-reset architecture with set circuitry and reset circuitry. The set circuitry may include logic gates and first latches arranged to receive multiple different data signals and then provide multiple different set signals based on a clock signal. Also, the reset circuitry may include at least one buffer and second latches that are arranged to receive the multiple different set signals from the set circuitry and then provide multiple different reset signals based on the clock signal.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various related techniques described herein, other and further implementations may be devised in accordance with the disclosure herein, which may be determined by the claims that follow.

Although the subject matter has been described herein in language specific to structural features and/or methodological acts, it should be understood that the subject matter defined in the appended claims is not necessarily limited to the specific features or acts described above. Rather, specific features and acts described above are disclosed as example forms of implementing the claims.

What is claimed is:

1. A device comprising:
    a set-reset circuit with multiple latches including a first latch, a second latch and a third latch, wherein:
        the first latch receives a first data signal from first logic and provides a first latched data signal as a first output based on a clock signal,
        the second latch receives a second data signal from second logic and provides a second latched data signal as a second output based on the clock signal, and
        the third latch receives a third data signal from third logic and provides a third latched data signal as a third output based on the clock signal, wherein:
            the first logic has a first gate and a second gate, and
            the second gate of the first logic receives at least the third output from the third latch, and provides the first data signal to the first latch, wherein the set-reset circuit is configured to reduce clock frequency in response to a detection of power supply droop.

2. The device of claim 1, wherein the multiple latches refer to multiple flip-flops, and wherein the first latch refers to a first flip-flop, the second latch refers to a second flip-flop, and the third latch refers to a third flip-flop.

3. The device of claim 1, wherein the first output refers to a first set signal, wherein the second output refers to a second set signal that is different than the first set signal, and wherein the third output refers to a third set signal that is different than the first set signal and the second set signal.

4. The device of claim 1, wherein the first latch receives the first data signal and provides the first output as a first set signal based on the clock signal, wherein the second latch receives the second data signal and provides the second output as a second set signal based on the clock signal, and wherein the third latch receives the third data signal and provides the third output as a third set signal based on the clock signal.

5. The device of claim 1, wherein the first gate receives a first threshold signal at an inverting input, receives the first output from the first latch, and provides a first intermediate signal to the second gate, and wherein the second gate receives the first intermediate signal.

6. The device of claim 5, wherein the first gate operates as an AND gate, and wherein the second gate operates as an OR gate.

7. The device of claim 5, wherein the second logic has a third gate, wherein the third gate receives the first threshold signal, receives the first output from the first latch, and provides a second intermediate signal to the second latch.

8. The device of claim 7, wherein the second intermediate signal is provided to the second latch so as to provide the second output as an approximately +50% clock cycle signal.

9. The device of claim 7, wherein the third gate operates as an AND gate.

10. The device of claim 1, wherein the third logic has a fourth gate and a fifth gate, wherein the fourth gate receives a second threshold signal, receives the first output from the first latch, and provides a third intermediate signal to the fifth gate, and wherein the fifth gate receives the third intermediate signal, receives the second output from the second latch, and provides the third data signal to the third latch.

11. The device of claim 10, wherein the third intermediate signal is provided to the third latch so as to provide the third output as a +100% clock cycle signal.

12. The device of claim 10, wherein the fourth gate operates as an AND gate, and wherein the fifth gate operates as an OR gate.

13. A device comprising:
    a set-reset circuit having at least one buffer and multiple latches including a first latch and a second latch, wherein:
        the at least one buffer receives a first data signal and provides a first output,
        the first latch receives a second data signal and provides a first latched data signal as a second output based on a clock signal, and
        the second latch receives a third data signal and provides a second latched data signal as a third output based on the clock signal, such that the third output is applied to the at least one buffer as the first data signal, wherein the set-reset circuit is configured to reduce clock frequency in response to a detection of power supply droop.

14. The device of claim 13, wherein the multiple latches refer to multiple flip-flops, and wherein the first latch refers to a first flip-flop, and wherein the second latch refers to a second flip-flop.

15. The device of claim 13, wherein the first output refers to a first reset signal, wherein the second output refers to a second reset signal that is different than the first reset signal, and wherein the third output refers to a third reset signal that is different than the first reset signal and the second reset signal.

16. A device comprising:

a set-reset circuit with set circuitry and reset circuitry, wherein the set circuitry includes logic gates and at least first and second latches, wherein the first and second latches of the set circuitry are arranged to receive respective data signals and then provide respective set signals based on a clock signal, and wherein the reset circuitry includes at least one buffer and first and second latches, wherein the first and second latches of the reset circuitry are arranged to receive the respective set signals from the set circuitry and then provide respective reset signals based on the clock signal, and wherein the set-reset circuit is configured to reduce clock frequency in response to a detection of power supply droop.

17. The device of claim 16, wherein:

the first latch of the set circuitry receives a first data signal from first logic and provides a first latched data signal as a first set signal of the respective set signals based on the clock signal, the second latch of the set circuitry receives a second data signal from second logic and provides a second latched data signal as a second set signal of the respective set signals based on the clock signal, and further comprising:

a third latch of the set circuitry, wherein the third latch receives a third data signal from third logic and provides a third latched data signal as a third set signal of the respective set signals based on the clock signal.

18. The device of claim 17, wherein the first latch of the set circuitry refers to a first flip-flop, the second latch of the set circuitry refers to a second flip-flop, and the third latch of the set circuitry refers to a third flip-flop.

19. The device of claim 17, wherein:

the at least one buffer receives an input signal and provides a first reset signal, the first latch of the reset circuitry receives the first set signal and provides a fourth latched data signal as a second reset signal based on the clock signal, and the second latch of the reset circuitry receives the second set signal and provides a fifth latched data signal as a third reset signal that is applied to the at least one buffer as the input signal based on the clock signal.

20. The device of claim 17, wherein the first latch of the reset circuitry refers to a fourth flip-flop, and wherein the second latch of the reset circuitry refers to a fifth flip-flop.

* * * * *